United States Patent
Luo et al.

(10) Patent No.: US 10,295,875 B2
(45) Date of Patent: May 21, 2019

(54) TFT ARRAY HAVING CONDUCTING LINES WITH LOW RESISTANCE

(71) Applicant: A.U. VISTA, INC., Milpitas, CA (US)

(72) Inventors: Fang-Chen Luo, Milpitas, CA (US);
Willem den Boer, Milpitas, CA (US);
Seok-Lyul Lee, Hsinchu (TW)

(73) Assignee: A.U. Vista, Inc., Milpitas, CA (US)

( * ) Notice: Subject to any disclaimer, the term of this patent is extended or adjusted under 35 U.S.C. 154(b) by 55 days.

(21) Appl. No.: 15/593,472

(22) Filed: May 12, 2017

(65) Prior Publication Data

US 2018/0329267 A1 Nov. 15, 2018

(51) Int. Cl.
*G02F 1/1362* (2006.01)
*H01L 29/786* (2006.01)
*H01L 27/12* (2006.01)

(52) U.S. Cl.
CPC .......... *G02F 1/136286* (2013.01); *G02F 2001/13629* (2013.01); *H01L 27/124* (2013.01); *H01L 27/1225* (2013.01); *H01L 27/1255* (2013.01); *H01L 29/7869* (2013.01)

(58) Field of Classification Search
CPC ..... G02F 1/136286; G02F 2001/13629; G02F 2001/13456; H01L 27/1255; H01L 27/124; H01L 29/7869; H01L 27/1225
See application file for complete search history.

(56) References Cited

U.S. PATENT DOCUMENTS

| | | | |
|---|---|---|---|
| 6,337,234 B2 | 1/2002 | Ha et al. | |
| 6,992,008 B2 | 1/2006 | Kobayashi et al. | |
| 7,579,201 B2 | 8/2009 | Kim et al. | |
| 8,592,237 B2 | 11/2013 | Lee et al. | |
| 2002/0064894 A1 | 5/2002 | Lee | |
| 2008/0239680 A1 | 10/2008 | Yasuda | |
| 2009/0181226 A1* | 7/2009 | Ning | H05K 3/1258 428/209 |
| 2011/0273648 A1* | 11/2011 | Lee | G02F 1/134363 349/106 |
| 2011/0299024 A1* | 12/2011 | Lee | G02F 1/133371 349/144 |
| 2012/0080605 A1* | 4/2012 | Kawanabe | G01T 1/243 250/370.08 |
| 2013/0175505 A1 | 7/2013 | Sung et al. | |
| 2014/0043552 A1 | 2/2014 | Chang et al. | |
| 2014/0291636 A1 | 10/2014 | Kim et al. | |
| 2017/0186831 A1* | 6/2017 | Nam | H01L 27/3272 |
| 2017/0278973 A1* | 9/2017 | Ando | H01L 27/1222 |
| 2017/0317111 A1* | 11/2017 | Ando | H01L 27/1052 |
| 2018/0097053 A1* | 4/2018 | Park | H01L 27/3276 |

* cited by examiner

*Primary Examiner* — Latanya N Crawford
(74) *Attorney, Agent, or Firm* — Ware, Fressola, Maguire & Barber LLP

(57) ABSTRACT

A pixel structure in a pixel for used in a display panel has a plurality of grooves made on a substrate and a plurality of conducting lines formed in the grooves. The conducting line can be made from a silver or copper conductive ink to provide a low-resistance line served as a gate line, common line or source line. In a pixel having a storage capacitor and a TFT with a gate electrode, a source electrode and a drain electrode, the gate electrode is connected to a gate line and a source electrode and one of the capacitor electrodes in the storage capacitor is connected to a common line. At least part of one or more of the gate electrode and the source electrode is disposed on top of and in contact with the surface of one or more conducting lines.

17 Claims, 17 Drawing Sheets

TFT ARRAY HAVING CONDUCTING LINES WITH LOW RESISTANCE

TECHNICAL FIELD

The present invention relates generally to a display panel and, more specifically, to an active matrix substrate having a TFT array for driving the display panel.

BACKGROUND OF THE INVENTION

A display panel generally has a large number of pixels arranged in a two dimensional array. To drive the display panel, an active matrix substrate includes a large number of switching elements made of thin-film transistors or TFTs to activate the pixels.

It is known in the art that each switching element has a drain electrode, a source electrode and a gate electrode and each pixel has a pixel electrode and a storage capacitor to store electric charges between the pixel electrode and a common line. As the size of the TFT-driven display panel becomes large and its resolution becomes high, the addressing time of the pixels becomes very short, the line resistance of the addressing lines becomes very high, and the capacitance loading of the display panel becomes high, causing the charging efficiency of the display pixel to decrease significantly. It is a recognized issue to lower the addressing line resistance and the capacitance loading, and to increase the TFT transconductance for the TFT array.

SUMMARY OF THE DISCLOSURE

The present invention provides a pixel structure in a display panel. The pixel structure includes a switching element and a storage capacitor formed on a substrate. The switching element has a gate electrode, a semiconductor layer and a high-k dielectric layer between the gate electrode and the semiconductor layer to enhance the transconductance of the switching element. The storage capacitor has a first storage capacitor electrode, a second storage capacitor electrode and a high-k dielectric layer between the first and second storage capacitor electrodes to enhance the storage capacitance. The high-k dielectric layer has a dielectric constant equal to or greater than 8. The switching element also has a drain electrode and a source electrode disposed on the semiconductor layer. The pixel structure also has a plurality of conducting lines to provide a common line, a gate line and a source line. The gate line electrically connected to the gate electrode; the source line electrically connected to the source electrode and the common line electrically connected to the storage capacitor. The substrate has a plurality of groove made thereon filled with a conducting material to provide the conducting lines. The common line and the gate line are arranged in the first direction on the substrate and the source line is arranged in the different second direction. The source line is segmented into source line segments and a source connector is used to provide electrical connection between two adjacent source line segments and the cross-over above the common line and the gate line. A low-k dielectric layer is used at the cross-over, wherein the low-k dielectric layer has a dielectric constant equal to or lower than 3.5.

Thus, a first aspect of the present invention is a pixel structure, comprising:

a switching element and a storage capacitor formed on the substrate, wherein the switching element comprises:

a gate electrode, a semiconductor layer, a first dielectric layer between the gate electrode and the semiconductor layer, and a source electrode and a drain electrode separately disposed on the semiconductor layer, and the storage capacitor comprises:

a first storage capacitor electrode, a second storage capacitor electrode, a second dielectric layer between the first storage capacitor electrode and the second storage capacitor electrode, wherein the pixel structure further comprises:

a source line electrically connected to the source electrode;

a gate line electrically connected to the gate electrode;

a common line electrically connected to the first storage capacitor electrode;

a plurality of grooves made on the substrate, and a plurality of conducting lines formed in the grooves to provide the gate line, the source line and the common line, wherein each of the conducting lines has a line surface adjacent to the substrate surface and wherein at least part of one of the gate electrode and the source electrode is disposed on top of and in contact with the line surface of one of the conducting lines.

According to an embodiment of the present invention, the source line comprises a plurality of electrically connected source-line segments.

According to an embodiment of the present invention, at least part of the first storage capacitor electrode is disposed on top of and in contact with the line surface of another one of the conducting lines.

According to an embodiment of the present invention, each of the first dielectric layer and the second dielectric layer has a dielectric constant equal to or greater than 8.

According to an embodiment of the present invention, the second dielectric layer is made from $Al_2O_3$ and the first dielectric layer comprises $Al_2O_3$ and a layer of $SiN_x$ or $SiO_2$.

According to an embodiment of the present invention, the substrate has a base substrate made from glass and a substrate insulating layer disposed on the base substrate to provide the substrate surface, and the grooves are made on the substrate insulating layer.

According to an embodiment of the present invention, the switching element further comprises an insulating layer, wherein the first gate electrode is disposed on the substrate surface;

the first dielectric layer is disposed on the gate electrode;

the insulating layer is disposed on the first dielectric layer; and the semiconductor layer is disposed on the insulating layer, wherein the insulating layer is made of $SiO_2$ or $SiN_x$ having a thickness greater than 200 Angstroms and less than 600 Angstroms.

According to an embodiment of the present invention, the pixel structure further comprises a pixel electrode, wherein the first storage capacitor electrode is disposed on the substrate surface;

the second dielectric layer is disposed on the first storage capacitor electrode; and part of the pixel electrode is disposed on the second dielectric layer for providing the second storage capacitor electrode.

According to an embodiment of the present invention, the pixel structure further comprises a buffer insulating layer disposed on the substrate surface, wherein the buffer insulating layer comprises a plurality of openings formed thereon, each of the openings located above a conducting line to expose part of the line surface.

According to an embodiment of the present invention, each of the grooves has a groove depth and each of the conducting lines has a thickness smaller than the groove depth, and the line surface of the conducting line is lower than the substrate surface, forming two opposing steps between the line surface and the substrate surface, and wherein each of the openings has an edge area, at least part of the edge area located on at least one of the steps, covering part of the line surface adjacent to said one of the steps.

According to an embodiment of the present invention, the switching element further comprises a second gate electrode disposed on the substrate surface between the buffer insulating layer and the substrate, and wherein the semiconductor layer is disposed on the buffer insulating layer, the gate electrode is disposed on the first dielectric layer, and the pixel electrode is electrically connected to the drain electrode.

According to an embodiment of the present invention, the first dielectric layer comprises a first insulator and a second insulator, the first insulator having a dielectric constant equal to or greater than 8, the second insulator made from an oxide insulator having a thickness greater than 200 Angstroms and less than 600 Angstroms.

According to an embodiment of the present invention, the buffer insulating layer is made from an organic polymer or $SiO_2$ or $SiN_x$ or a composite film of the organic polymer and $SiO_2$ or $SiN_x$.

According to an embodiment of the present invention, the pixel structure further comprises a pixel electrode, a third dielectric layer and a third storage capacitor electrode, the third storage capacitor electrode disposed on the substrate surface between the substrate and the buffer insulating layer, wherein the second storage capacitor electrode is disposed on the buffer insulating layer;

the second dielectric layer is disposed on the second storage capacitor electrode;

the first storage capacitor electrode is disposed on the second dielectric layer;

the third dielectric layer is disposed on the first storage capacitor electrode; and the pixel electrode is disposed on the third dielectric layer, and the pixel electrode is electrically connected to the second storage capacitor electrode, the first storage capacitor electrode is electrically connected to the third storage capacitor electrode.

According to an embodiment of the present invention, the second dielectric layer has a dielectric constant equal to or greater than 8, and the third dielectric layer has a dielectric constant equal to or smaller than 3.5.

According to an embodiment of the present invention, the second storage capacitor electrode is made from a metalized oxide semiconductor, said pixel structure further comprising a metal layer arranged to electrically connect the first storage capacitor electrode to the common line, wherein the metal layer is disposed on top of and in contact with the common line.

According to an embodiment of the present invention, the metal layer is also arranged to electrically connect the first gate electrode to the second gate electrode.

A second aspect of the present invention is a process for making electrical connection in a display panel comprising a substrate having a substrate surface, the display panel further comprising a plurality of pixels and a plurality of conducting lines, each pixel having a switching element and a storage capacitor formed on the substrate, the process comprising:

providing at least one groove on the substrate, the groove having two opposing groove edges;

disposing a conducting material in the groove for providing one of the conducting lines;

depositing an insulating layer on the substrate surface covering the groove;

removing part of the insulating layer to provide a via in the insulating layer over the groove to expose part of the conducting material, the via having a via edge covering at least one of the groove edges;

disposing a metal layer on the substrate, part of the metal layer located on top of and in contact with the conducting material through the via for providing electrical connection between said conducting line to at least one of the switching element and the storage capacitor.

According to an embodiment of the present invention, the groove has a groove depth and the conducting material has a thickness, the process further comprising:

curing the conducting material in the groove prior to depositing the insulating layer on the substrate surface, wherein the thickness of the conducting material after curing is smaller than the groove depth, forming a step between the conducting material and the substrate surface at each of the groove edges, and wherein the via edge is arranged to cover the step at at least one of the groove edges.

According to an embodiment of the present invention, the groove depth is greater than 0.5 micron and the insulating layer is made from a polymer or $SiO_2$ or $SiN_x$ or a composite layer of polymer and $SiO_2$ or $SiN_x$.

DETAILED DESCRIPTION OF THE INVENTION

The present invention provides a pixel structure in a pixel for used in a display panel that reduces the line resistance. According to various embodiments of the present invention, the substrate of the display panel comprises a plurality of grooves made on the substrate and a plurality of conducting lines formed in the grooves. The conducting line can be made from a silver or copper conductive ink to provide a low-resistance line served as a gate line, common line or source line. Alternatively, the conducting line can be made from electroless printing copper. In a pixel having a storage capacitor and a TFT with a gate electrode, a source electrode and a drain electrode, the gate electrode is connected to a gate line, a source electrode is connected to a source line, and one of the capacitor electrodes in the storage capacitor is connected to a common line. According to an embodiment of the present invention, at least part of one or more of the gate electrode, the source electrode and the capacitor electrode is disposed on top of and in contact with the surface of one or more conducting lines.

According to an embodiment of the present invention, the gate insulator in the TFT and the capacitor insulator in the storage capacitor has a high-k dielectric layer to enhance the transconductance of the TFT and to increase the capacitance of the storage capacitor. At the cross-over between a gate line and a source line and the between a common line and a source line, a low-k dielectric layer is used as an insulator in order to reduce the cross-over capacitance and the loading of the array driving.

It should be noted that the conductive material that is filled the groove to provide the conducting line may shrink in its dimensions when the conductive material is cured. As such the surface of the conducting line may be lower than the surface of the substrate. Thus, a steep step may occur. When a conducting thin-film layer is used as a gate electrode, a source electrode or a capacitor electrode deposited on the substrates surface to be connected to the conducting line, the steep step between the substrate surface and the conducting line may disrupt the electrical connection. According to an embodiment of the present invention, a buffer insulating layer is disposed on the substrate surface, the buffer insulating layer having a via or opening made therein so as to expose part of the conducting line, wherein the opening has an opening ridge disposed on top of one or both steep steps. The buffer insulating layer can be made from an organic material (Acrylic or other polymers) or an inorganic material ($SiO_2$ or $SiN_x$) or a composite layer of organic material and inorganic material.

FIGS. 1-6

Figure 1:
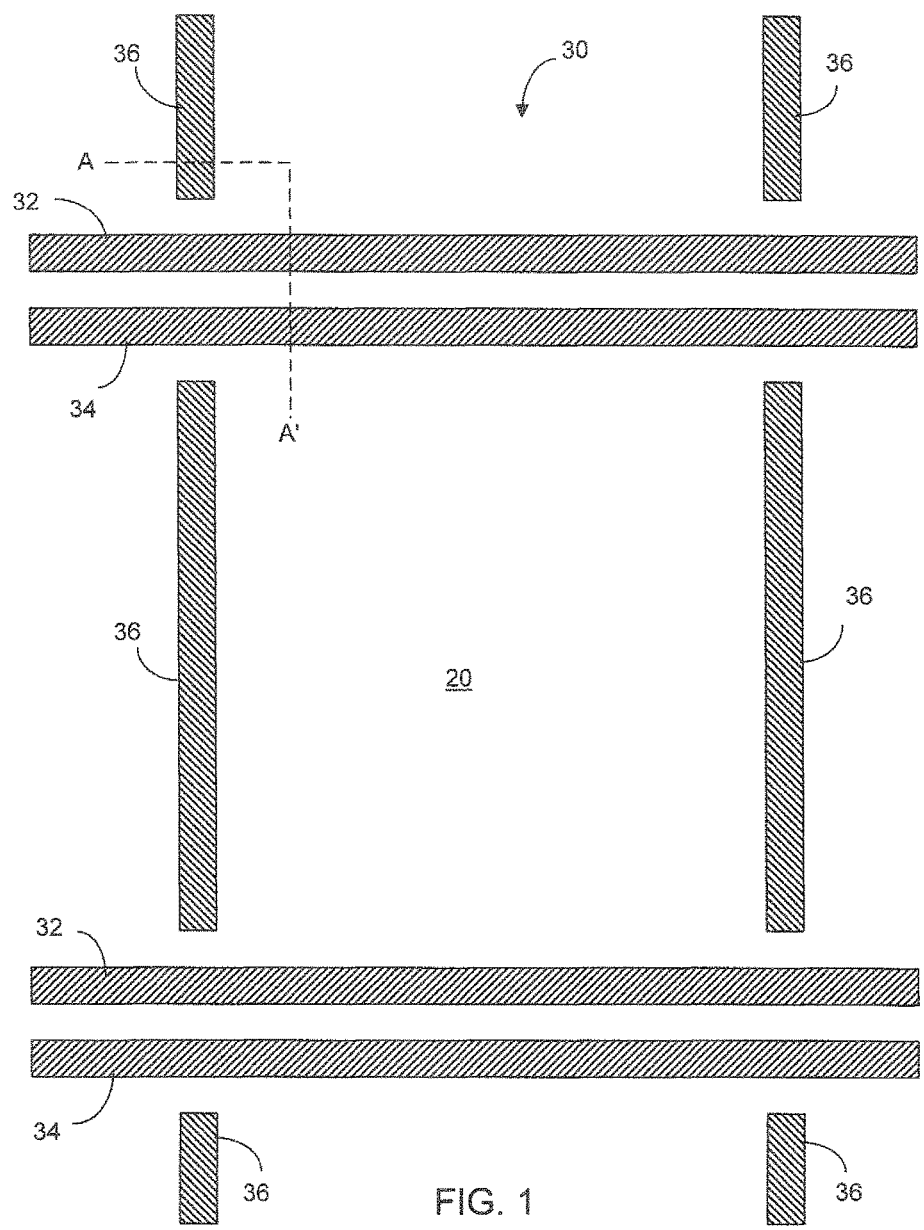
FIG. 1 illustrates a substrate having a plurality of grooves made thereon and each of which has a filled conducting line.
Figure 2:
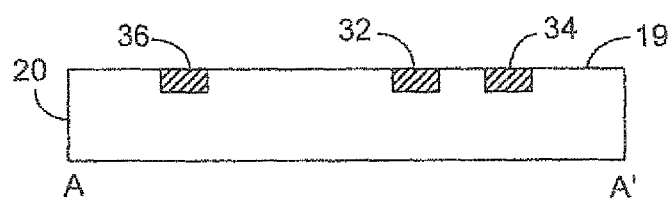
FIG. 2 is a cross-sectional view of the substrate along a path marked as A-A'.

FIG. 1 illustrates a substrate having a plurality of grooves made thereon and each of which has a filled conducting line, according to embodiment of the present invention. As shown in FIG. 1, the substrate 20 in a pixel 30 has a plurality of conducting lines, including gate lines 32, common lines 34 and source lines 36. Each of the source lines 36 is segmented so as to avoid being electrically connected to the gate lines 32 and common lines 34. FIG. 2 shows a cross-sectional view of the substrate 20 along a path marked as A-A' in FIG. 1. As seen in FIG. 2, the conducting lines are gate line 32, common line 34 and source line 36 and they are made from a conducting material 24 filled in the grooves 21 on the substrate 20 (see FIGS. 12A, 12B). The conducting material 24 can be silver or copper ink conductor, for example. The conducting lines can also be made from electroless printing copper. The thickness of the conducting lines can be 0.5 um or greater and as such, the electrical resistance of the conducting lines is lower than the thin-film conducting lines deposited on the surface of the substrate.

Figure 3:
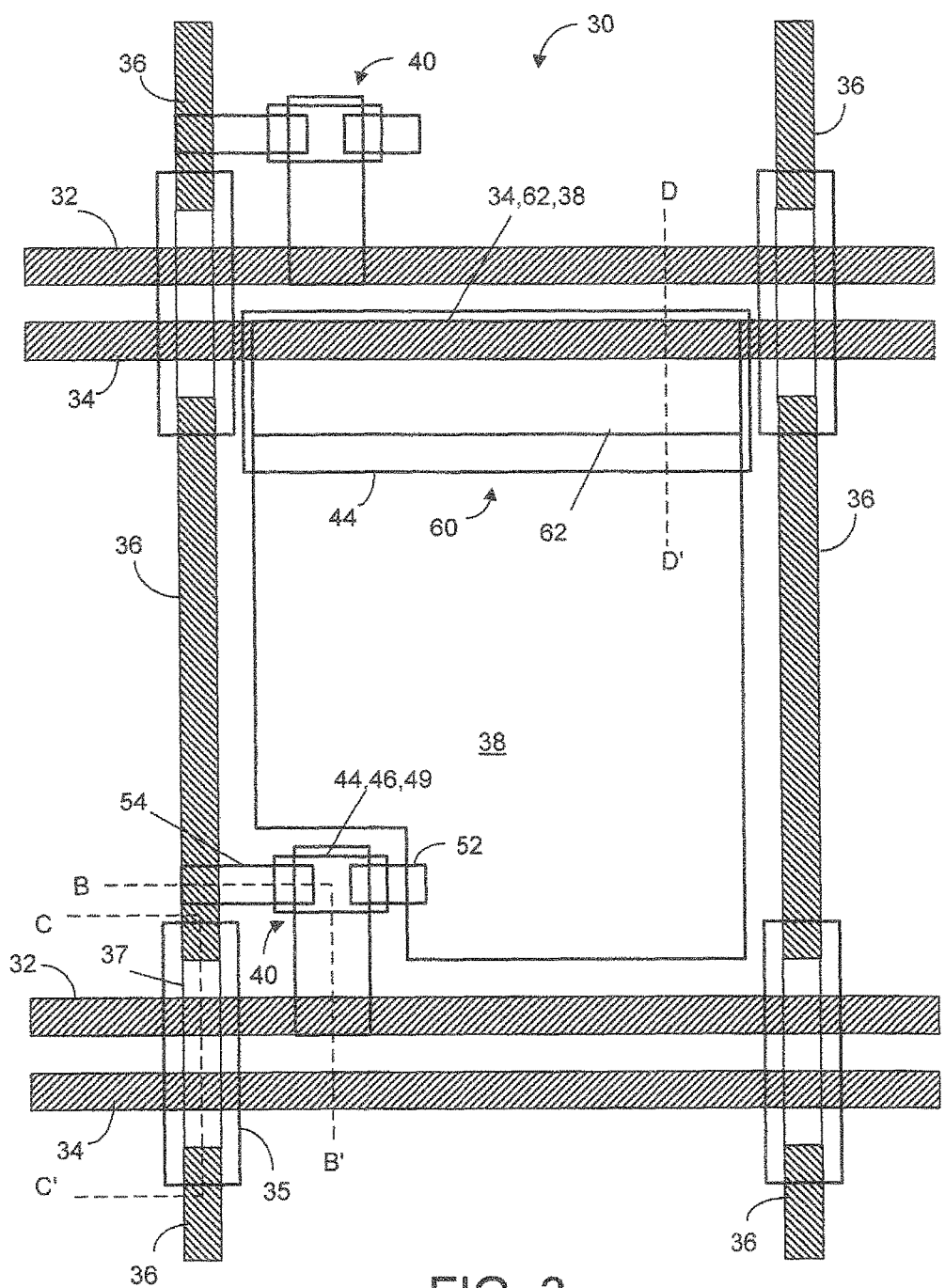
FIG. 3 illustrates a pixel structure formed on the substrate, according to an embodiment of the present invention.
Figure 3A:
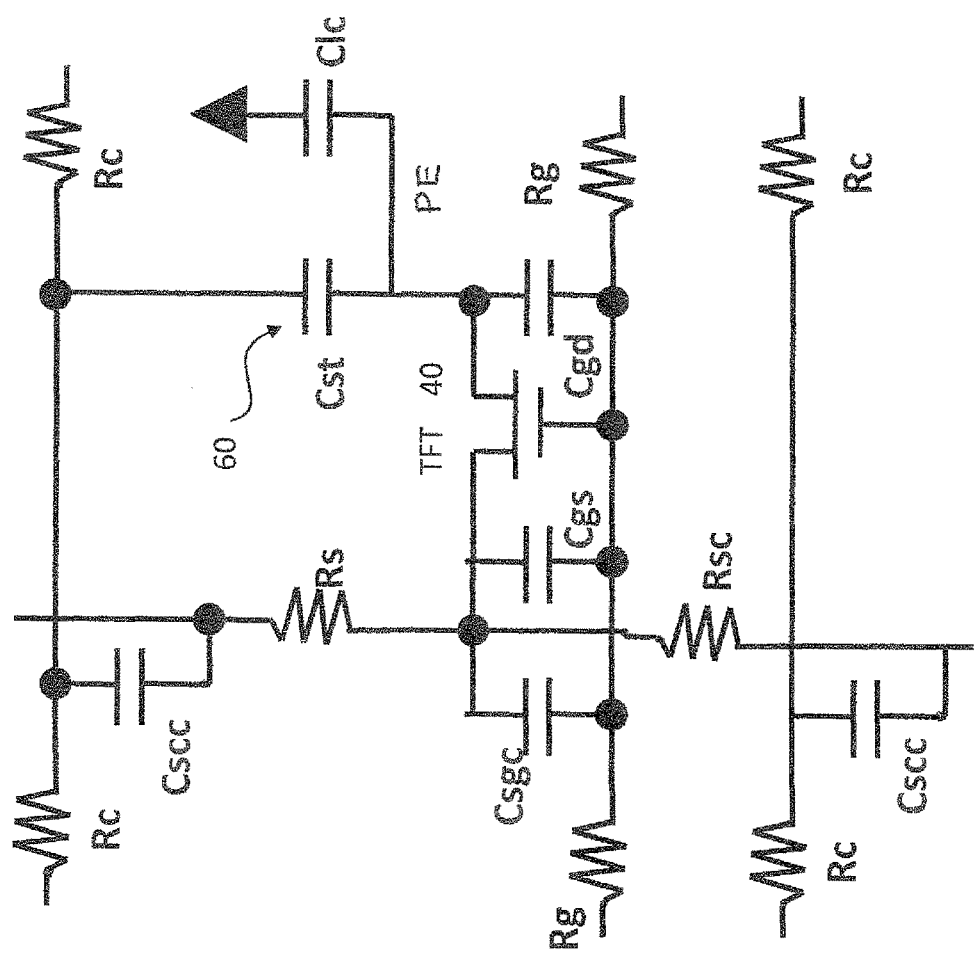
FIG. 3A is a circuit diagram showing the resistance and capacitance in the pixel structure of FIG. 3.
Figure 5:
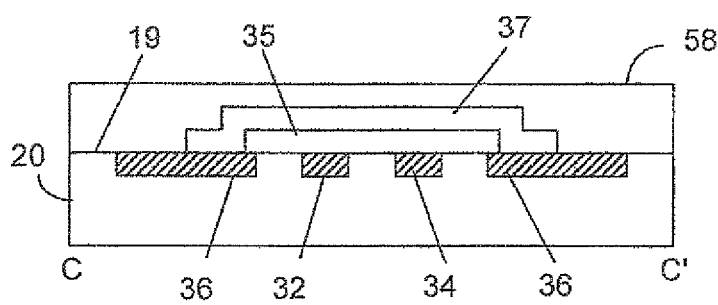
FIG. 5 is a cross-sectional view of the pixel structure along a path marked as C-C'.
Figure 6:
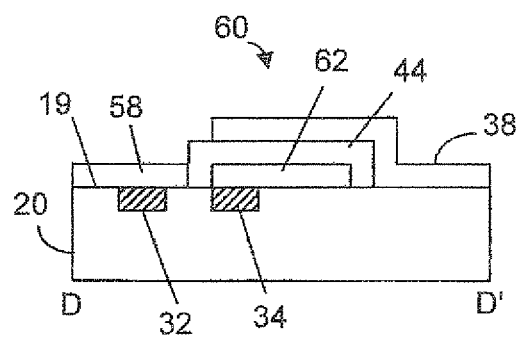
FIG. 6 is a cross-sectional view of the pixel structure along a path marked as D-D'.

FIG. 3 is a top view of the pixel 30 having various layers disposed on the substrate 20 for forming a thin-film transistor (TFT) 40 and a storage capacitor 60, along with a pixel electrode 38. The layer structure of the TFT 40 can be seen in FIG. 4, which is a cross-sectional view of the TFT along a path marked as B-B' in FIG. 3. FIG. 5 is a cross-sectional view of the source connector 37 along a path marked as C-C' in FIG. 3. FIG. 6 is a cross-sectional view of the storage capacitor 60 along a path marked as D-D' in FIG. 3. FIG. 3A is a circuit diagram showing the resistance and capacitance in the pixel structure as shown in FIG. 3. In FIG. 3A, PE is the pixel electrode; Rc is the resistance in the common line 34; Rg is the resistance in the gate line 32; Rs is the resistance in the source line 36; Rsc is the resistance in the source connector 37; Cscc is the crossover capacitance between the source line 36 and the common line 34; Csgc is the crossover capacitance between the source line 36 and the gate line 32; Cgs is the gate-source capacitance; Cgd is the gate-drain capacitance; Cst is the storage capacitance and Clc is the liquid crystal capacitance. In order to reduce the crossover capacitance, a low-k dielectric material is used at the crossover (see FIG. 5).

Figure 4:
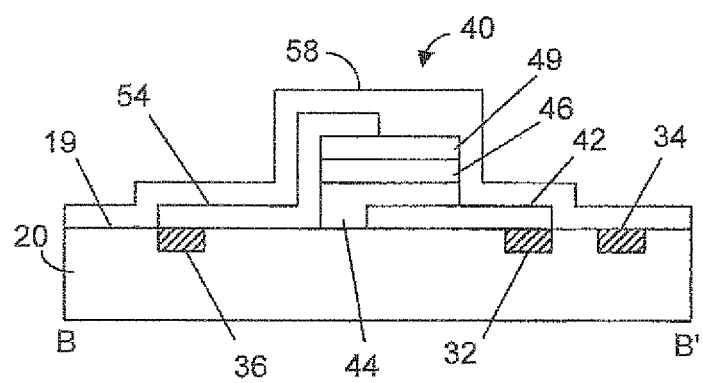
FIG. 4 is a cross-sectional view of the pixel structure along a path marked as B-B'.

As seen in FIG. 4, a gate electrode 42 of TFT 40 is disposed on the surface of the substrate 20. Part of the gate electrode 42 is disposed on top of and in contact with the surface of the gate line 32. A high-k insulator 44 is disposed on part of the substrate surface 19 and part of the gate electrode 42. Another insulator layer 46 is disposed on the high-k insulator 44. The insulator layer 46 can be an $SiN_x$ or $SiO_2$ layer having a thickness of 0.5 um or less, for example. The high-k insulator 44 and the insulator layer 46 are used as a gate insulator. The high-k insulator layer has a dielectric constant equal to or greater than 8. A semiconductor layer 49 is disposed on top of the insulator layer 46. A source electrode 54 is disposed on the substrate surface for electrically connecting the source line 36 to the semiconductor layer 49. According to an embodiment of the present invention, part of the source electrode 54 is disposed on top of and in contact with the surface of source line 36. A passivation layer 58 is disposed on top of the semiconductor layer 49.

FIG. 5 shows a crossover section of a source line 36. As seen in FIG. 5, a crossover insulator layer 35 is disposed on the surface of the substrate 20, covering the gate line 32 and the common line 34. The two adjacent segments of the source line 36 are connected with a conducting source connector 37. According to an embodiment of the present invention, the crossover insulator layer 35 is made from a low-k insulating material so as to reduce the crossover capacitance and the loading of array driving. For example, the dielectric constant of the crossover insulator layer 35 can be 3.5 or lower.

FIG. 6 is a cross-sectional view of part of a storage capacitor 60. As seen in FIG. 6, a metal layer is disposed on the substrate surface 19 to form a first capacitor electrode 62. Part of the first capacitor electrode 62 is disposed on top of and in contact with the common line 34. A high-k insulator 44 is disposed on the substrate surface, partly covering the first capacitor electrode 62, as the storage capacitor insulator. A pixel electrode 38 is disposed on the substrate surface, and the high-k insulator 44 as the second storage capacitor electrode. To form various parts of TFT 40 and storage capacitor 60, a metal layer is deposited and patterned into the source electrode 54 (FIG. 4), source connector 37 (FIG. 6) and a drain electrode 52 (FIG. 3) connected to the pixel electrode 38 (FIG. 3, connecting pixel electrode 38 and TFT 40). According to an embodiment of the present invention, the substrate 20 can be a glass substrate with grooves 21 made thereon (see FIG. 12A, for example).

FIGS. 7A-11

Figure 7A:
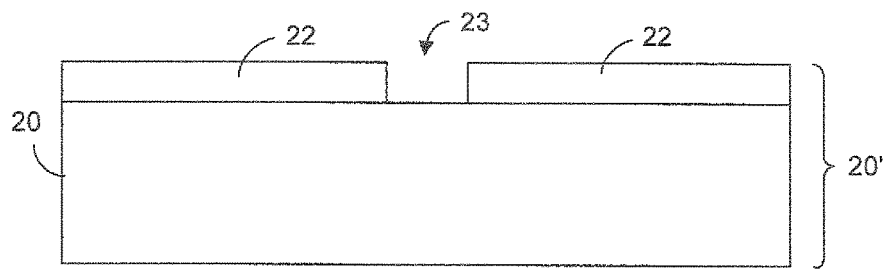
FIGS. 7A and 7B illustrate a method for forming a filled conducting line in a groove, according to an embodiment of the present invention.
Figure 7B:
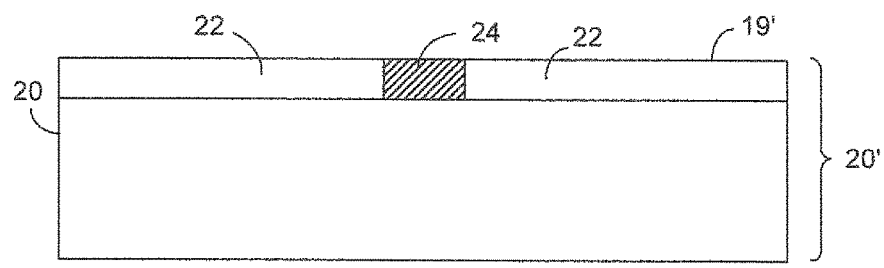
Figure 8:
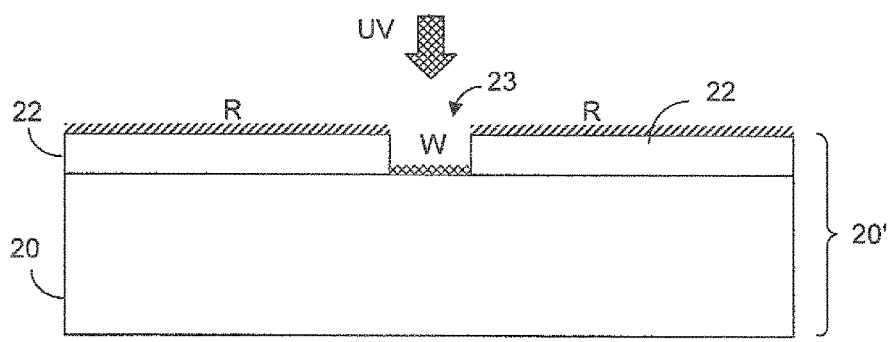
FIG. 8 shows a method for achieving a filled conducting line in a groove, according to an embodiment of the present invention.

According to another embodiment of the present invention, the substrate can be a glass substrate 20 coated with a layer of substrate insulating layer 22, and the grooves 23 are formed in the substrate insulating layer 22 as shown in FIG. 7A. A conducting material such as ink (Ag or Cu, for example) or electroless printing metal (Cu, for example) is filled in the grooves 23 as a filled conductor 24 as shown in FIG. 7B. According to an embodiment of the present invention, the substrate insulating layer 22 can be made of SiN and has a thickness of 0.5 um or greater, for example. The substrate insulating layer 22 can be deposed on the glass substrate 20 and patterned to provide the grooves 23. A Photo-Induced Surface Control (PISC) material is deposited on the patterned substrate insulating layer 22. The PISC material is an ink-repellent material but can be selectively changed into a wettable material by UV irradiation through a mask, for example. As shown in FIG. 8, the surface of groove 23 is wettable while the surface of the remaining insulating layer 22 is repellent. When the wettable/repellent surface is made contact with a conductive ink solution (through a dipping process, for example), the conductive ink is attached to and deposited on the wettable groove 23 to form the filled conductor 24 as shown in FIG. 7B.

Figure 9A:
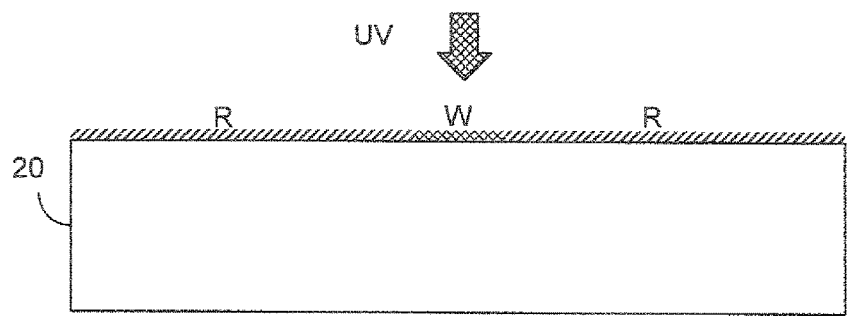
FIGS. 9A-9D illustrate a different method for achieving a filled conducting line in a groove, according to an embodiment of the present invention.
Figure 9B:
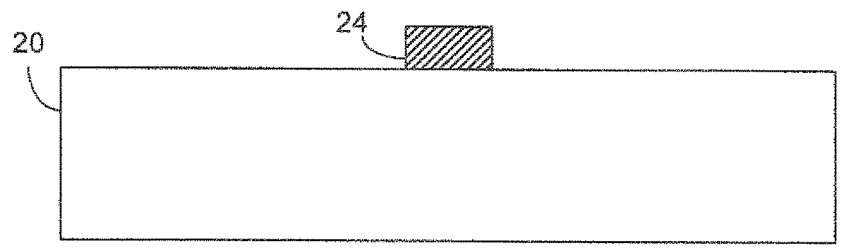
Figure 9C:
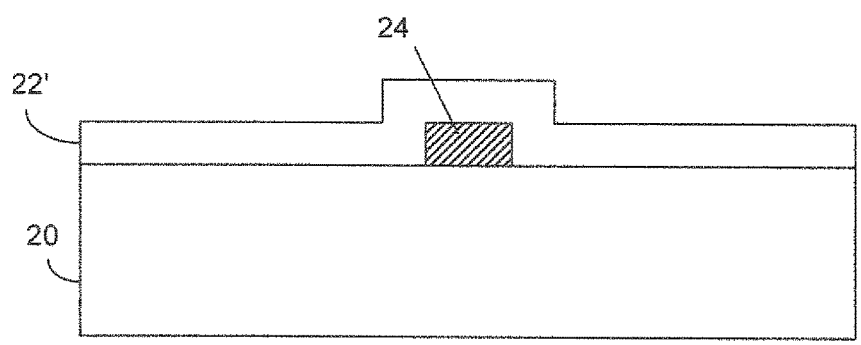
Figure 9C:
Figure 9D:
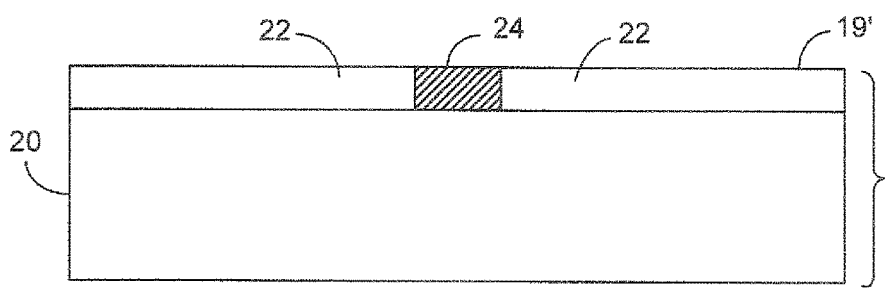

Alternatively, a PISC material is deposited on the surface of the glass substrate 20 and exposed to UV irradiation through to mask to form a surface with wettable and repellent areas as shown in FIG. 9A. The wettable/repellent surface is made contact with a conducting ink solution. The conductive ink (such as Ag or Cu nano-ink) in the solution is deposited on the wettable area to form a conductive line having the filled conductor 24 as shown in FIG. 9B. A substrate insulating layer 22' is deposited on the glass substrate 20 and the filled conductor 24 as shown in FIG. 9C. The substrate insulating layer 22' can be made from a photo-imageable polymer or an insulator SiN having a thickness of 1 um, for example. The substrate insulating layer 22' is then exposed to UV irradiation through the other side of the glass substrate 20 as shown in FIG. 9C. The un-exposed part of the substrate insulating layer 22' and its adjacent areas are removed and planarized to become the substrate insulating layer 22 as shown in FIG. 9D. The substrate insulating layer 22 and the glass substrate 20 form an integrated substrate 20' with a substrate surface 19'.

Figure 10:
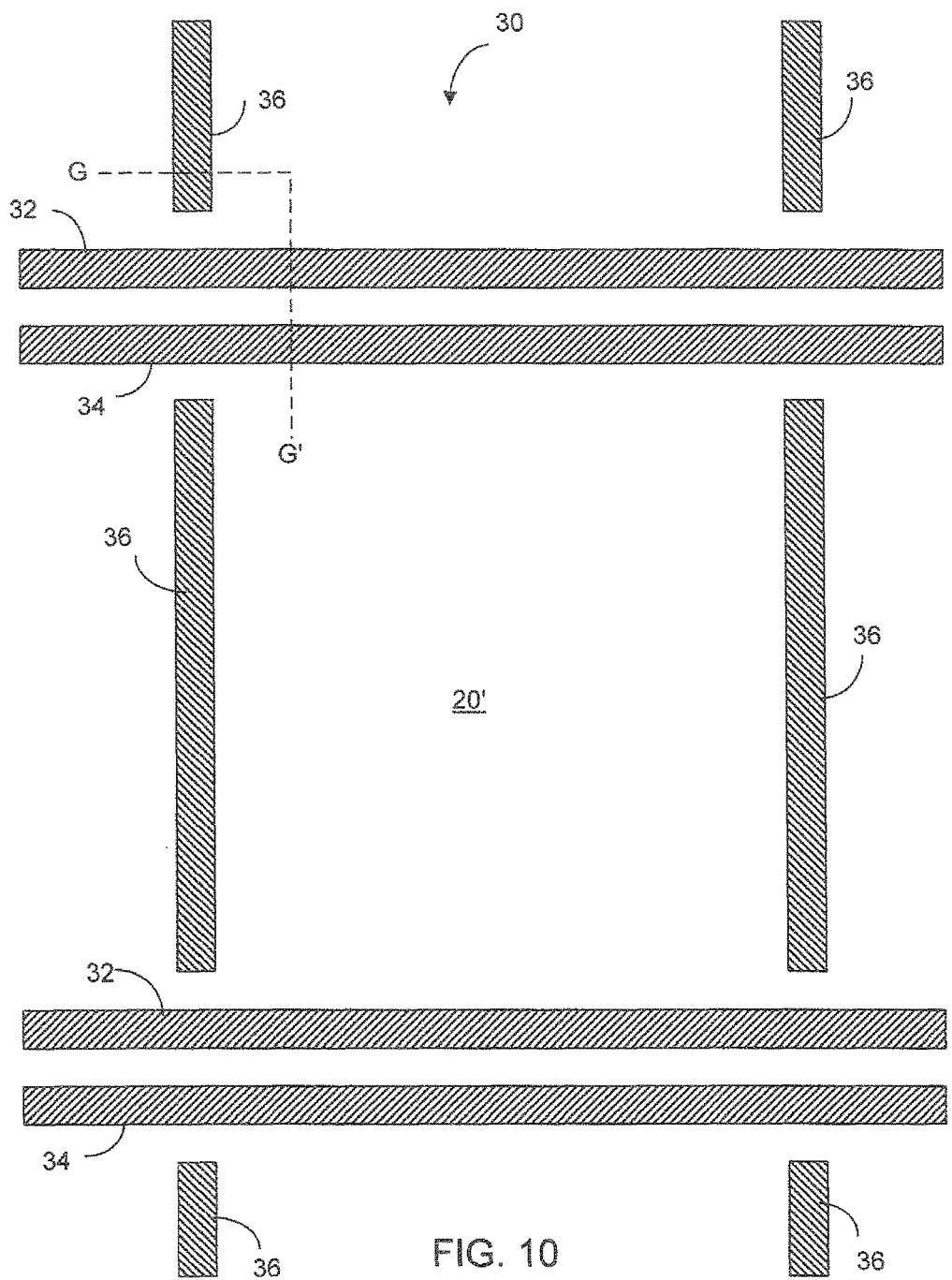
FIG. 10 illustrates a substrate having a plurality of grooves made thereon and each of which has a filled conducting line, according to an embodiment of the present invention.
Figure 11:
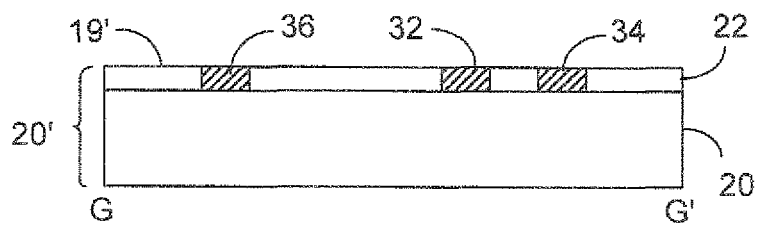
FIG. 11 is a cross-sectional view of the substrate along a path marked as G-G'.

FIG. 10 shows a substrate 20' having a plurality of grooves 23 (see FIG. 7A) with filled conductor 24 (FIG. 7B, 9D) to provide a plurality of conducting lines, including (segmented) source lines 36, gate lines 32 and common lines 34. A cross sectional view along a path marked as G-G' is shown in FIG. 11. As shown in FIG. 11, the conducting lines are gate line 32, common line 34 and source line 36 and they are made from a conducting material 24 filled in the grooves 23 on the substrate 20' (see FIGS. 7A, 7B). As with the embodiment as shown in FIG. 2, the conducting material can be a silver or copper ink conductor, for example. The conducting lines can also be made from electroless printing copper. Based on the disclosure above, a skilled person in the art can incorporate the structures in FIG. 4-6 and FIG. 11 to realize similar structures as depicted in FIG. 4-6 on the substrate insulating layer 22.

FIGS. 12A-13

Figure 12A:
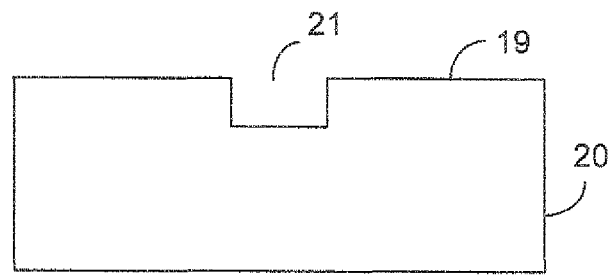
FIGS. 12A-12D illustrate a groove made on a substrate having a filled conducting line and a buffer insulator disposed on the substrate.
Figure 12B:
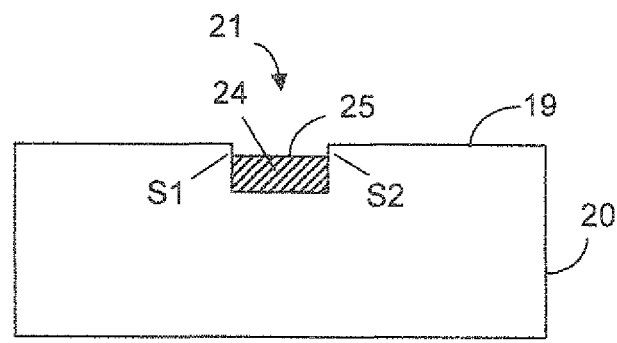
Figure 12C:
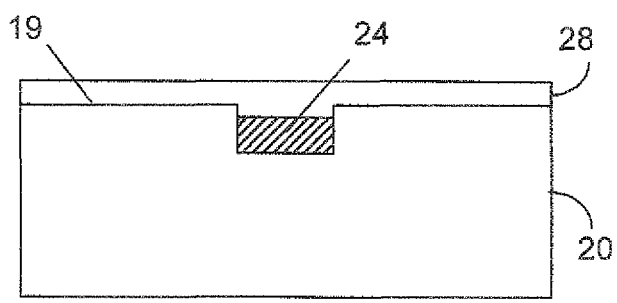
Figure 12D:
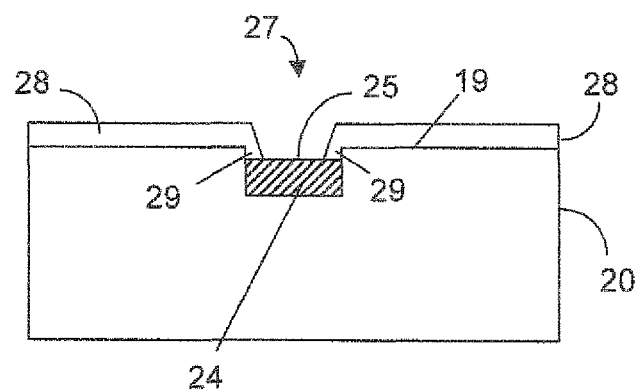
Figure 13:
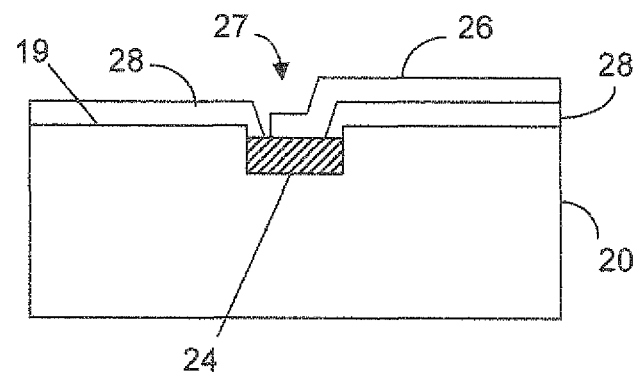
FIG. 13 illustrates a metal layer disposed on the buffer layer and the filled conducting line.

According to an embodiment of the present invention, the conducting lines in a pixel 30 can be formed from a conducting material filled in the grooves 21 of a glass substrate 20 as shown in FIGS. 12A and 12B. When the thickness of the filled conductor 24 is smaller than the depth of the groove 21—due to the shrinkage of the conducting material during the curing process or other reasons, the surface 25 of the filled conductor 24 is lower than the substrate surface 19 and two steep steps S1 and S2 could form on opposing sides of the groove 21. When a thin-film conducting material is deposited on the substrate 20 and the filled conductor 24 for electrical connection, the electrical connection may fail due to line disruption. According to an embodiment of the present invention, a buffer insulating layer 28 is deposited on the surface of the substrate 20 over the filled and cured conductor 24 as shown in FIG. 12C. The buffer insulating layer 28 can be made from an organic material (e.g. Acrylic or other polymers) or an inorganic material (e.g. $SiO_2$ or $SiN_x$). The buffer insulating layer 28 can also be a composite film of the organic material and the inorganic material. A via or opening 27 is made on the buffer insulating layer 18 in order to expose the filled conductor 24. At least one of the via edges 29 is located over the steps S1, S2 formed by the difference between the substrate surface 19 and the surface 25 of the filled conductor 24 as shown in FIG. 12D. As such, a metal layer 26 can be deposited on the filled conductor 24 without contacting the steep edge of the groove as shown in FIG. 13. The gate lines, source lines or common lines depicted in the previous and the following embodiments and can be constructed according the instant structure by the instant method to mitigate the steep step problem.

FIGS. 14-19

Figure 14:
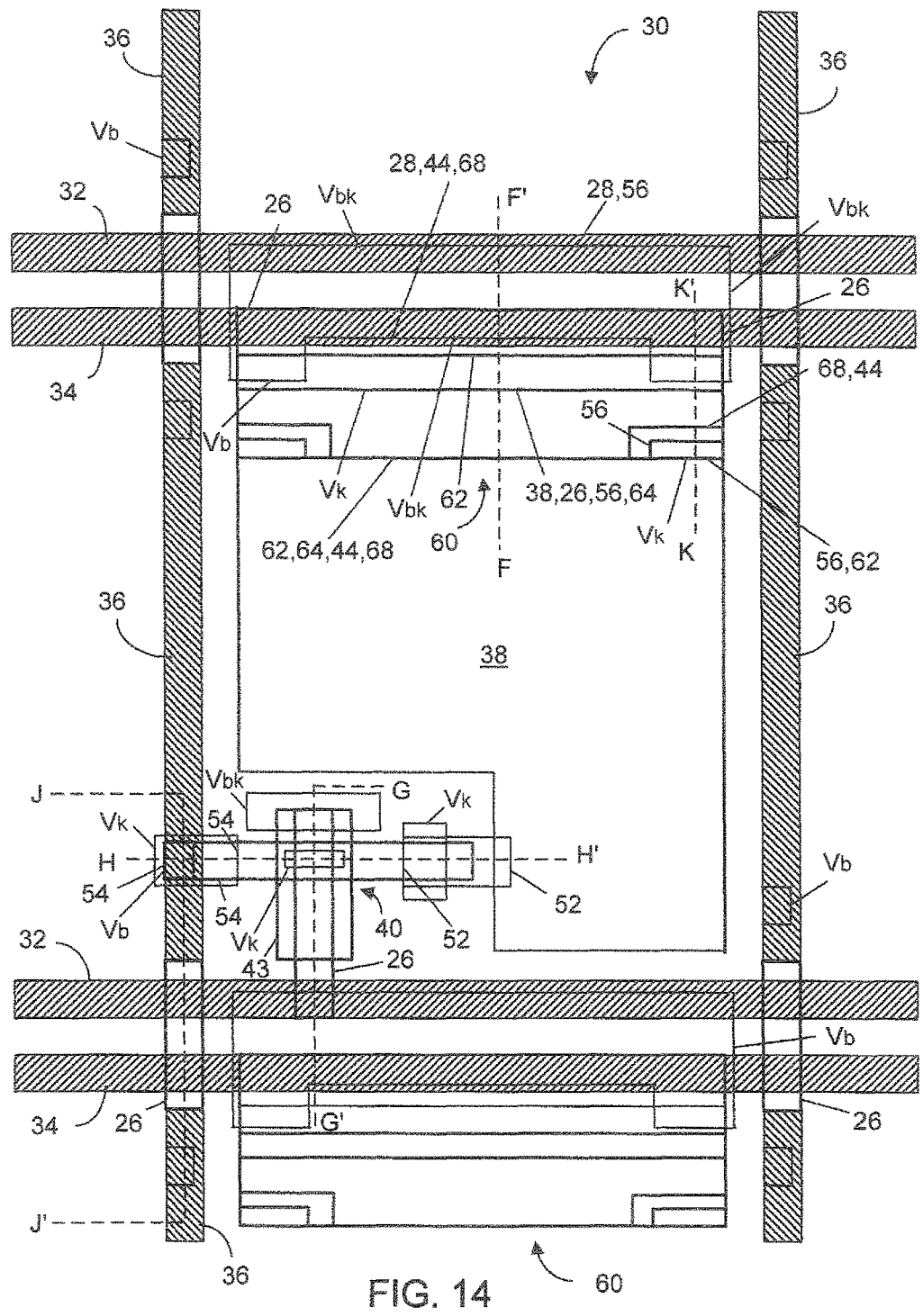
FIG. 14 illustrates a pixel structure disposed on the substrate having a buffer layer.
Figure 14A:
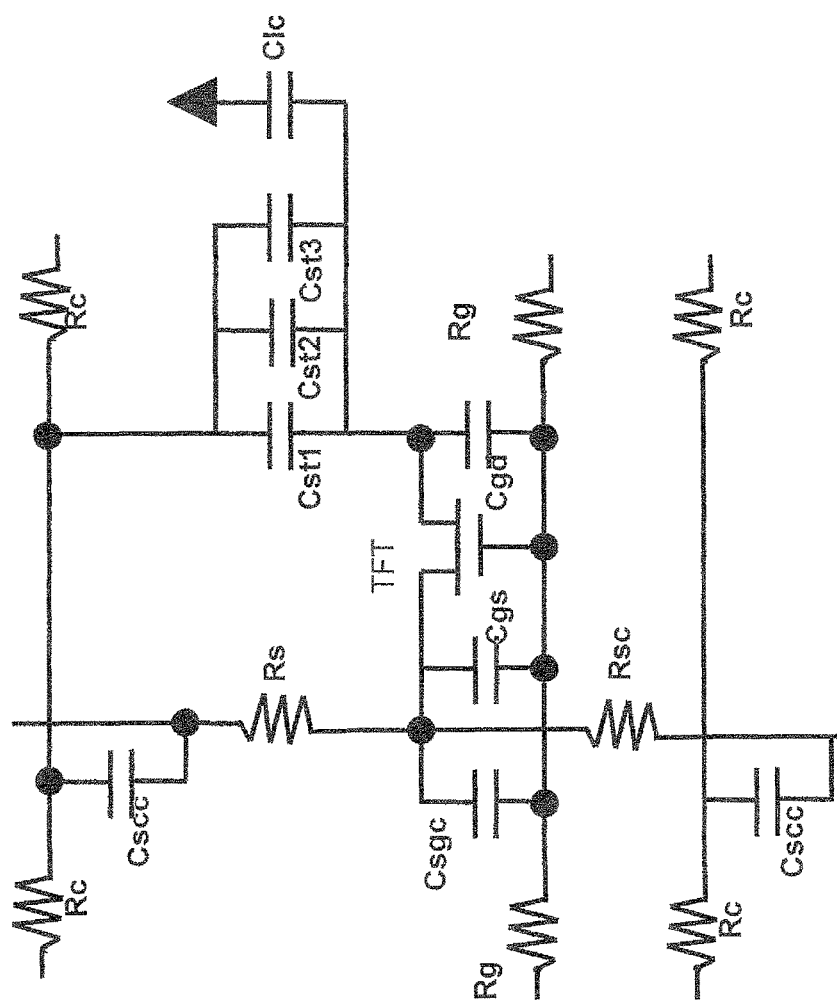
FIG. 14A is a circuit diagram showing the resistance and capacitance in the pixel structure of FIG. 14.
Figure 15:
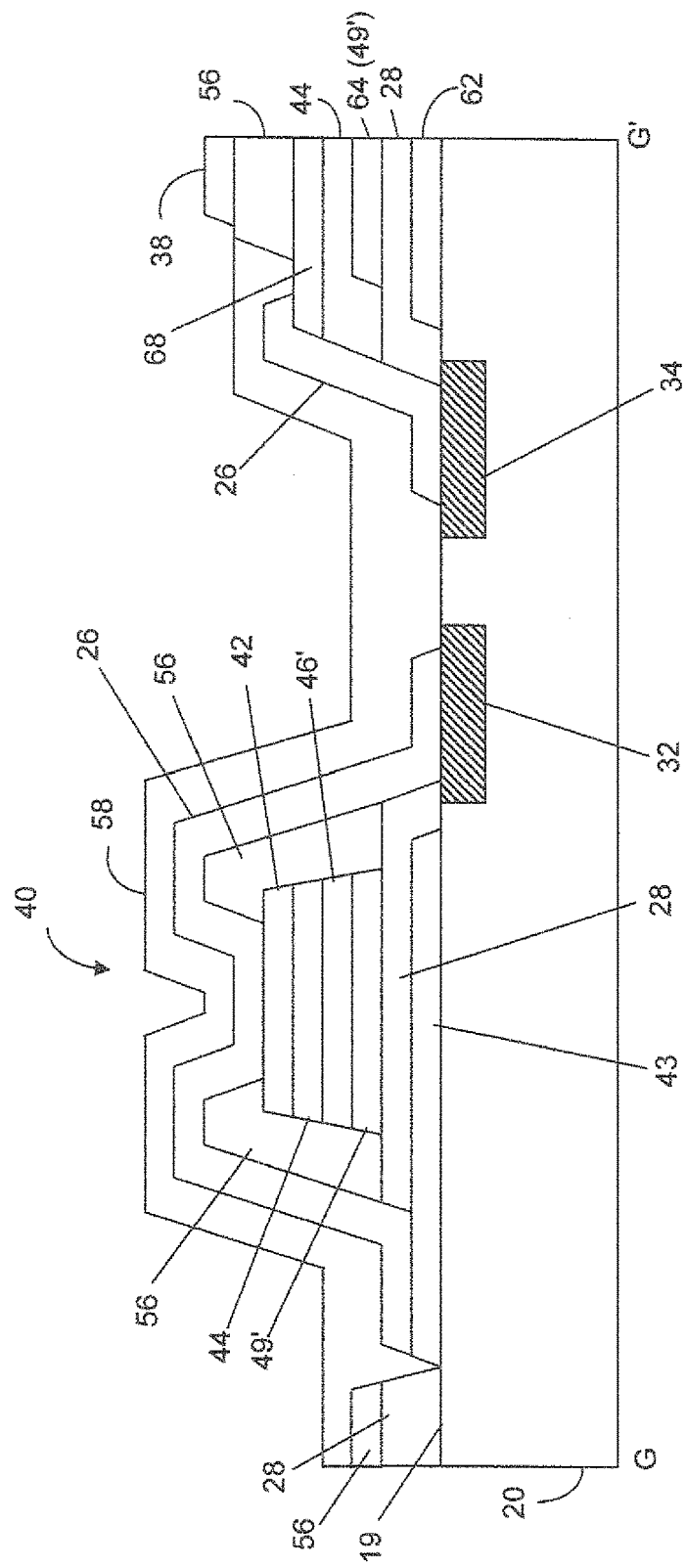
FIG. 15 is a cross-sectional view of the pixel structure along a path marked as G-G'.
Figure 16:
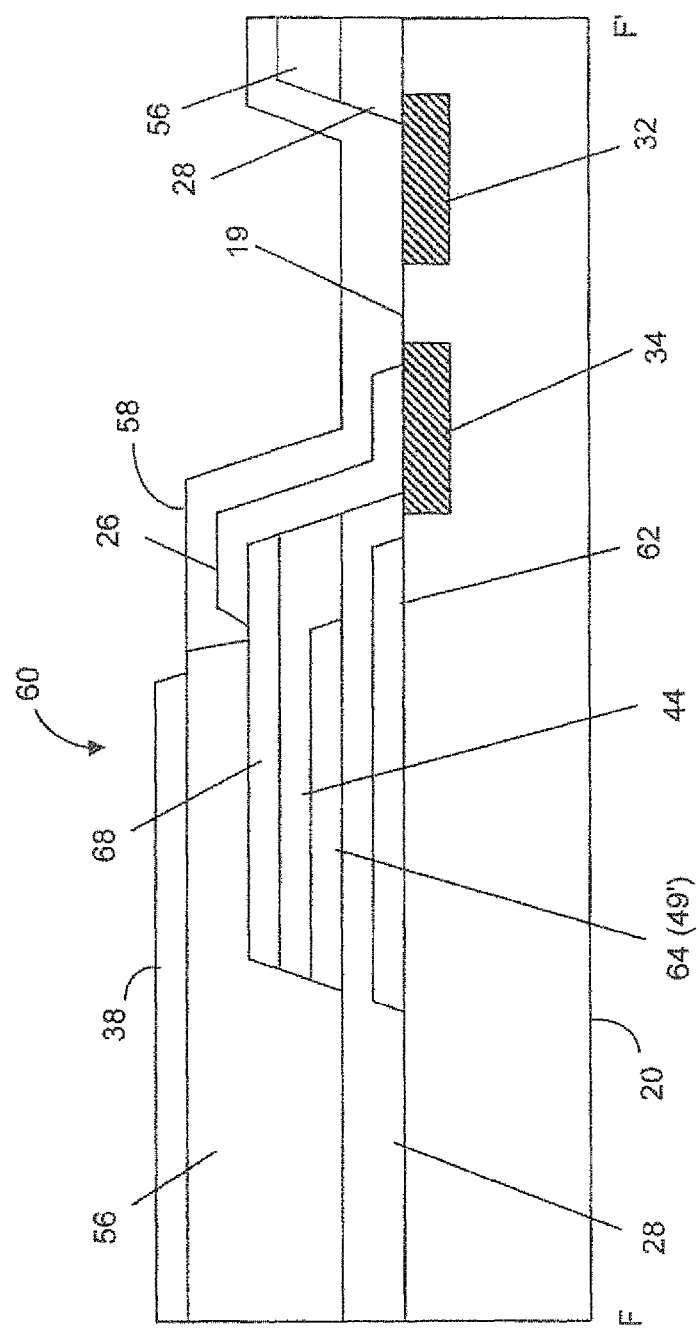
FIG. 16 is a cross-sectional view of the pixel structure along a path marked as F-F'.
Figure 17:
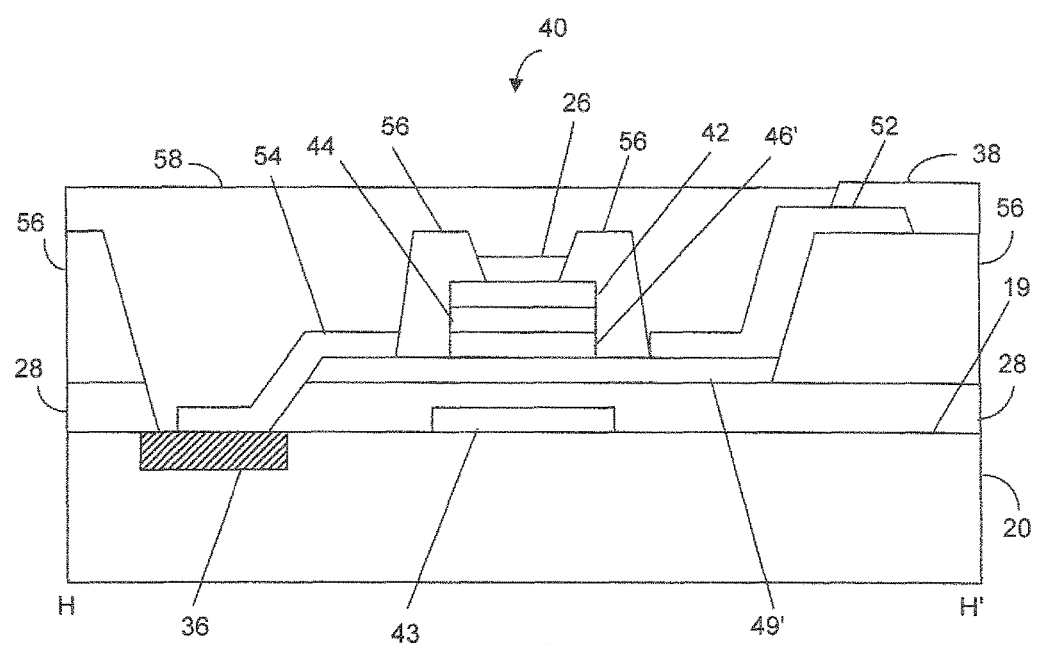
FIG. 17 is a cross-sectional view of the pixel structure along a path marked as H-H'.
Figure 18:
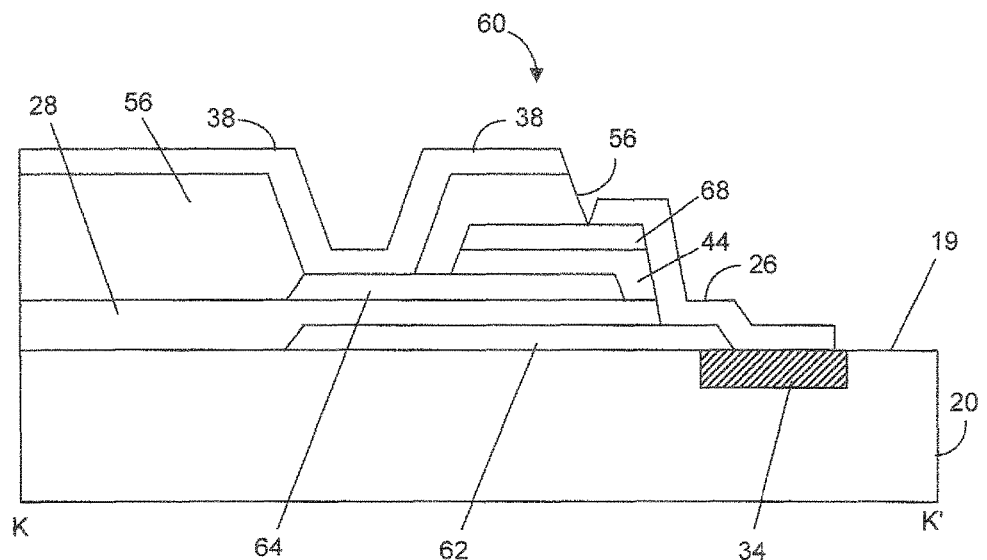
FIG. 18 is a cross-sectional view of the pixel structure along a path marked as K-K'.
Figure 19:
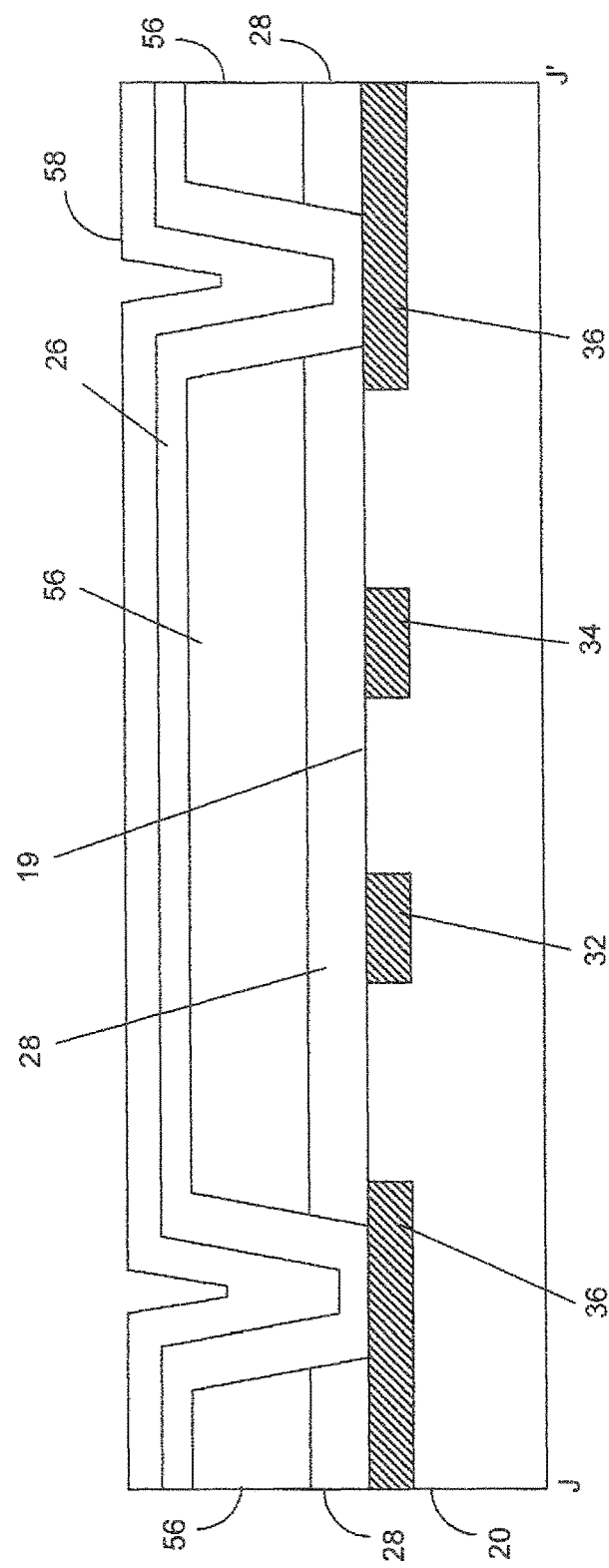
FIG. 19 is a cross-sectional view of the pixel structure along a path marked as J-J'.

Another embodiment of the present invention that utilizes the low-resistance conducting lines is shown in FIGS. 14-19. FIG. 14 shows the top view of a pixel 30 with a different pixel structure having various layers to form a switching element 40, a storage capacitor 60 and the bridging source connector 37 connecting two adjacent segments of the source line 36. The pixel 30 has a plurality of paths marked as F-F', G-G', H-H', J-J' and K-K'. The cross-sectional view of the pixel structure along path G-G' is shown in FIG. 15; the cross-sectional view of the pixel structure along path F-F is shown in FIG. 16; the cross-sectional view of the pixel structure along path H-H' is shown in FIG. 17; the cross-sectional view of the pixel structure along path K-K' is shown in FIG. 18; and the cross-sectional view of the pixel structure along path J-J' is shown in FIG. 19. FIG. 14A is a circuit diagram showing the resistance and capacitance in the pixel structure as shown in FIG. 14. In FIG. 14A, PE is the pixel electrode; Rc is the resistance in the common line 34; Rg is the resistance in the gate line 32; Rs is the resistance in the source line 36; Rsc is the resistance in the source connector 37; Cscc is the crossover capacitance between the source line 36 and the common line 34; Csgc is the crossover capacitance between the source line 36 and the gate line 32; Cgs is the gate-source capacitance; Cgd is the gate-drain capacitance; Cst1 is the capacitance between the first and second storage capacitor electrodes; Cst2 is the capacitance between the second and third storage capacitor electrodes and Cst3 is the capacitance between the third storage capacitor electrode and the pixel electrode 38. As shown in FIG. 15, a high-k dielectric material is used in layer 44 between the second storage capacitor electrode 64 and the third storage capacitor electrode 68 to enhance the storage capacitance.

The pixel structure for pixel 30 as shown in FIG. 14 can be realized as follow: First, grooves 21 (see FIG. 12A) are made on the substrate 20 to the depth greater than 0.5 micron and then filled with conductive material 24 and cured to become conducting lines. The conducting lines include gate lines 32, common lines 34 and segmented source lines 36. A layer of metal such as Al or Mo is deposited and patterned to form bottom gate electrode 43 and first capacitor electrode 62. A layer of organic or inorganic or a composite organic and inorganic insulator is deposited as a buffer insulating layer 28. The organic insulator can be a polymer. Inorganic insulator can be silicon dioxide or nitride. The insulator is patterned to have vias (Vb's) exposing parts of gate line 32, common line 34 and segmented source line 36 and first capacitor electrode 62. At least one edge of the vias is located above the exposed conducting lines. Then a layer of semiconductor 49' such as oxide semiconductor (indium gallium zinc oxide, IGZO) is deposited, followed by a layer of oxide insulator 46'. A region of the oxide insulator 46' is etched to expose a region of the oxide semiconductor 49'. The exposed region of the oxide semiconductor 49' is treated to become a conductor. The exposed region consists of the second capacitor electrode 64 for the storage capacitor 60. The treatment can be a plasma treatment. A layer of high-k insulator 44 with a dielectric constant greater than 8 such as $Al_2O_3$ is deposited followed by a second metal layer 42 such as Cu or Al or Mo. A half-tone photolithographic process is utilized to etch the second metal layer 42, the high-k insulator 44, the oxide insulator 46' and oxide semiconductor 49' in sequence to form the TFT island (40) and the third storage capacitor electrode 68. The etching then exposes the source and drain region in the oxide semiconductor 49'. Subsequently the exposed oxide semiconductor 49' is made as conductor by a process such as plasma treatment (the island of 42, 44 and 46' serve as a self-align mask during the plasma treatment). As such, the oxide semiconductor layer outside the channel covered by the island is metalized. A low-k insulator such as polymer 56 is deposited. Via holes (Vk's) are opened to expose gate lines 32, common lines 34, segmented source lines 36, bottom gate electrode 43, first storage capacitor electrode 62, TFT source region and drain region and storage capacitor contact regions 64 and 68. A metal layer 26 is deposited to form the source electrode 54 and drain electrode 52 and to connect the TFT gate electrode 42 to the bottom gate electrode 43 and gate line 32; to connect the source electrode 54 to segmented source line 36, and to connect the third storage capacitor electrode 68 to the common line 34. The metal layer 26 is also used to provide electrical connection between two segmented source lines 36. A layer of ITO is deposited and patterned to form pixel electrode 38 which is connected to the second storage capacitor electrode 64 and the drain electrode 52.

In the TFT 40, bottom gate electrode is 43; the bottom gate insulator is the buffer insulating layer 28. The semiconductor is oxide semiconductor 49'. The island of metal 42, high-k insulator 44 and oxide insulator 46' form a self-align mask during the plasma treatment in order to metalize the exposed oxide semiconductor for forming a part of the source drain electrode. The exposed oxide semiconductor is then connected to segmented source line 36 by source electrode 54 and to pixel electrode 38 by drain electrode 52 (see HH' cross section shown in FIG. 17). The top gate electrode 42 and bottom gate electrode 43 are connected by the metal layer 26 to gate line 32 (see GG' cross section shown in FIG. 15). In the TFT 40, the layer of oxide insulator 46' serves as an interface between the oxide semiconductor 49' and the high-k insulator 44. The thickness of 46' is desired to be between 200 to 600 angstroms to optimize the performance of the TFT.

In the storage capacitor 60, the first capacitor electrode is 62. The first capacitor insulator is the buffer insulating layer 28. The second capacitor electrode 64 is part of the metalized oxide semiconductor 49'. The second insulator is the high-k insulator 44. The third capacitor electrode is 68 which is connected to the first capacitor 62 electrode by metal layer 26 on the surface 19 of glass substrate 20 before reaching the common line 34 which has a step. This connection is made at the upper right and left corner of the storage capacitor 60 (K' side—see KK' cross section shown in FIG. 18). Part of pixel electrode 38 forms a fourth capacitor electrode which is connected to the metalized oxide semiconductor used as the second capacitor electrode 64 through a via hole Vk in the low-k insulator 56. The via holes are at the lower right and left corners of the storage capacitor 60 (K side—see KK' cross section shown in FIG. 18) In the GG' cross section as shown in FIG. 15, the third capacitor electrode 68 is connected to common line 34 by metal layer 26 over one edge of a via in low k insulator 56 and a via in buffer insulator 28. The contact point between metal layer 26 and common line 34 is on the surface of common line 34. The third capacitor electrode 68 is also connected to the first capacitor electrode 62 by metal layer 26 at the upper right and left corners of the storage capacitor 60, and the contact between metal layer 26 and first capacitor electrode 62 is on glass substrate 19 (see KK' cross section shown in FIG. 18). In FIG. 14, Vbk means a via through both the buffer insulating layer 28 and the low-k dielectric layer 56.

Figure 16A:
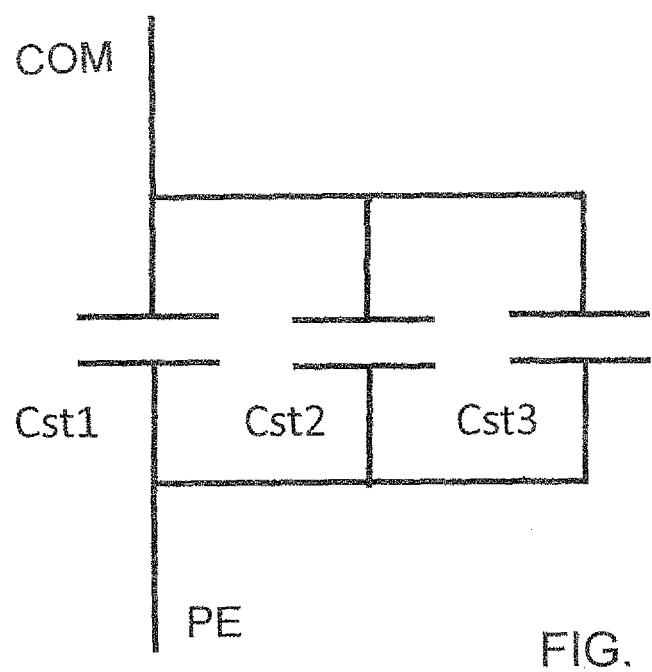
FIG. 16A is a circuit diagram showing the capacitance in the storage capacitor as shown in FIG. 16.

FIG. 16A shows the capacitance of the storage capacitor 60 as shown in FIG. 16. In FIG. 16A, PE is the pixel electrode; COM is the common line; Cst1 is the capacitance between the first and second storage capacitor electrodes 62, 64; Cst2 is the capacitance between the second and third storage capacitor electrodes 64, 68 and Cst3 is the capacitance between the third storage capacitor electrode 68 and the pixel electrode 38. As shown in FIG. 16, a buffer insulating layer 28 is used between the first storage capacitor electrode 62 and the second storage capacitor electrode 64; a high-k dielectric material is used in layer 44 between the second storage capacitor electrode 64 and the third storage capacitor electrode 68 to enhance the storage capacitance; a low-k insulator 56 is used between the third storage capacitor electrode 68 and the pixel electrode 38.

In summary, the present invention makes use of conducting lines made of filled conductors in grooves on the substrate to reduce the line resistance. The conducting lines include common lines, gate lines and segmented source lines and each of the conducting line has a surface. In a pixel structure, according to various embodiments of the present invention, at least one of the gate electrode, the source electrode and a storage capacitor electrode is disposed on top of and in contact with the line surface of one of conducting lines. The pixel structure also has metal layers As shown in FIGS. 4, 15 and 16, a passivation layer 58 is disposed on the pixel structure excluding the pixel electrode 38. It is understood that a passivation layer is also disposed on the pixel structure as shown in FIGS. 17 and 18—excluding the pixel electrode 38. The pixel structures as disclosed herein above are only exemplary embodiments to show how the conducting lines in grooves are connected to various electrodes. Furthermore, a person of ordinary skill in the art would understand that when a connector is used to connect a source electrode to a source line, that connector is also part of the source electrode. Likewise, a connector connecting a gate electrode to a gate line is also part of the gate electrode; a connector connecting a capacitor electrode to a common line is also a part of the capacitor electrode.

Thus, although the present invention has been described with respect to one or more embodiments thereof, it will be understood by those skilled in the art that the foregoing and various other changes, omissions and deviations in the form and detail thereof may be made without departing from the scope of this invention.

What is claimed is:

1. A pixel structure for use in a display panel comprising a substrate having a substrate surface, said pixel structure comprising:
    a switching element and a storage capacitor formed on the substrate, wherein
    the switching element comprises:
        a first gate electrode,
        a semiconductor layer,
        a first dielectric layer between the first gate electrode and the semiconductor layer, and
        a source electrode and a drain electrode separately disposed on the semiconductor layer, and wherein
    the storage capacitor comprises:
        a first storage capacitor electrode,
        a second storage capacitor electrode,
        a second dielectric layer between the first storage capacitor electrode and the second storage capacitor electrode, wherein the pixel structure further comprises:
    a source line electrically connected to the source electrode;
    a gate line electrically connected to the first gate electrode;
    a common line electrically connected to the first storage capacitor electrode;
    a plurality of grooves made on the substrate, and
    a plurality of conducting lines formed in the grooves to provide the gate line, the source line and the common line, wherein each of the conducting lines has a line surface adjacent to the substrate surface and wherein at least part of one of the first gate electrode and the source electrode is disposed on top of and in contact with the line surface of one of the conducting lines.

2. The pixel structure according to claim 1, wherein the source line comprises a plurality of electrically connected source-line segments.

3. The pixel structure according to claim 1, wherein at least part of the first storage capacitor electrode is disposed on top of and in contact with the line surface of another one of the conducting lines.

4. The pixel structure according to claim 1, wherein each of the first dielectric layer and the second dielectric layer has a dielectric constant equal to or greater than 8.

5. The pixel structure according to claim 4, wherein the second dielectric layer is made from $Al_2O_3$ and the first dielectric layer comprises $Al_2O_3$ and a layer of SiNx or $SiO_2$.

6. The pixel structure according to claim 1, wherein the substrate has a base substrate made from glass and a substrate insulating layer disposed on the base substrate to provide the substrate surface, and wherein the grooves are made on the substrate insulating layer.

7. The pixel structure according to claim 1, wherein the switching element further comprises an insulating layer, and wherein
    the first gate electrode is disposed on the substrate surface;
    the first dielectric layer is disposed on the first gate electrode;
    the insulating layer is disposed on the first dielectric layer; and
    the semiconductor layer is disposed on the insulating layer.

8. The pixel structure according to claim 7, wherein the insulating layer is made of $SiO_2$ or $SiN_x$ having a thickness greater than 200 Angstroms and less than 600 Angstroms.

9. The pixel structure according to claim 1, wherein the pixel structure further comprises a pixel electrode, and wherein
    the first storage capacitor electrode is disposed on the substrate surface;
    the second dielectric layer is disposed on the first storage capacitor electrode; and
    at least part of the pixel electrode is disposed on the second dielectric layer for providing the second storage capacitor electrode.

10. The pixel structure according to claim 1, further comprising a buffer insulating layer disposed on the substrate surface, wherein the buffer insulating layer comprises a plurality of openings formed thereon, each of the openings located above one of the conducting lines to expose part of the line surface.

11. The pixel structure according to claim 10, wherein each of the grooves has a groove depth and each of the conducting lines has a thickness smaller than the groove depth, and the line surface of the conducting line is lower than the substrate surface, forming two opposing steps between the line surface and the substrate surface, and wherein each of the openings has an edge area, at least part of the edge area located on at least one of the steps, covering part of the line surface adjacent to said one of the steps.

12. The pixel structure according to claim 10, wherein the switching element further comprises a second gate electrode disposed on the substrate surface between the buffer insulating layer and the substrate, and wherein
    the semiconductor layer is disposed on the buffer insulating layer, the first gate electrode is disposed on the first dielectric layer, and the pixel electrode is electrically connected to the drain electrode.

13. The pixel structure according to claim 12, where the first dielectric layer comprises a first insulator and a second insulator, the first insulator having a dielectric constant equal to or greater than 8 and the second insulator is made from an oxide insulator having a thickness greater than 200 Angstroms and less than 600 Angstroms.

14. The pixel structure according to claim 12, wherein the buffer insulating layer is made from an organic polymer or $SiO_2$ or $SiN_x$ or a composite layer of an organic polymer and $SiO_2$ or $SiN_x$.

15. The pixel structure according to claim 12, further comprising a pixel electrode, a third dielectric layer and a third storage capacitor electrode, the third storage capacitor electrode disposed on the substrate surface between the substrate and the buffer insulating layer, wherein the second storage capacitor electrode is disposed on the buffer insulating layer;

the second dielectric layer is disposed on the second storage capacitor electrode;

the first storage capacitor electrode is disposed on the second dielectric layer;

the third dielectric layer is disposed on the first storage capacitor electrode; and the pixel electrode is disposed on the third dielectric layer, the pixel electrode electrically connected to the second storage capacitor electrode, the first storage capacitor electrode electrically connected to the third storage capacitor electrode.

16. The pixel structure according to claim 15, wherein the second dielectric layer has a dielectric constant equal to or greater than 8, and the third dielectric layer has a dielectric constant equal to or smaller than 3.5.

17. The pixel structure according to claim 15, wherein the second storage capacitor electrode is made from a metalized oxide semiconductor, said pixel structure further comprising a metal layer arranged to electrically connect the third storage capacitor electrode to the common line, wherein the metal layer is disposed on top of and in contact with the common line, and wherein the metal layer is further arranged to electrically connect the first gate electrode to the second gate electrode.

\* \* \* \* \*